United States Patent
Lacker et al.

(10) Patent No.: US 9,698,453 B2
(45) Date of Patent: Jul. 4, 2017

(54) ADJUSTABLE LENGTH BATTERY ELECTROLYTE PROBE

(71) Applicant: Curtis Instruments, Inc., Mt. Kisco, NY (US)

(72) Inventors: Steven J. Lacker, Blauvelt, NY (US); Vincent Ioanna, Fairfield, CT (US); Richard Jonke, Danbury, CT (US)

(73) Assignee: Curtis Instruments, Inc., Mt. Kisco, NY (US)

( * ) Notice: Subject to any disclaimer, the term of this patent is extended or adjusted under 35 U.S.C. 154(b) by 400 days.

(21) Appl. No.: 14/554,229

(22) Filed: Nov. 26, 2014

(65) Prior Publication Data
US 2016/0146893 A1    May 26, 2016

(51) Int. Cl.
*H01M 10/48*    (2006.01)
*G01R 31/36*    (2006.01)
*G01R 1/067*    (2006.01)

(52) U.S. Cl.
CPC ....... *H01M 10/486* (2013.01); *H01M 10/484* (2013.01); *G01R 1/06788* (2013.01); *G01R 31/3606* (2013.01)

(58) Field of Classification Search
CPC .............. H01M 10/484; H01M 10/488; G01F 23/0061; G01F 23/268; G01N 9/14; G01R 1/06788; G01R 31/3658
See application file for complete search history.

(56) References Cited

U.S. PATENT DOCUMENTS

| | | | | | |
|---|---|---|---|---|---|
| 3,891,465 | A | * | 6/1975 | Muto | H01M 10/484 429/61 |
| 4,866,428 | A | * | 9/1989 | Hinkle | G01F 23/2921 320/137 |
| 5,187,979 | A | * | 2/1993 | Edmark, III | G01F 23/268 141/115 |
| 5,550,474 | A | * | 8/1996 | Dahl | G01F 23/261 324/432 |
| 5,841,357 | A | * | 11/1998 | Henry | H01M 10/484 324/433 |
| 5,936,382 | A | * | 8/1999 | Jones | G01F 23/242 320/132 |
| 6,040,079 | A | * | 3/2000 | Mcmurren | H01M 10/484 429/91 |

(Continued)

OTHER PUBLICATIONS

Curtis Products Acuity Battery Monitoring System, Retrieved Nov. 2014, from http://curtisinstruments.com/?fuseaction=Products.Acuity, 4 pages.

(Continued)

*Primary Examiner* — Alesa Allgood
(74) *Attorney, Agent, or Firm* — Harrington & Smith (57) ABSTRACT

Disclosed herein is an apparatus. The apparatus includes a sensor head section, a base section, a telescoping section, and an electronic component. The base section is connected to the sensor head section. The telescoping section includes a first end and a second end. The telescoping section is connected to the base section. The electronic component is proximate the first end of the telescoping section. The electronic component is protected from making contact with high current, electrically conductive battery elements and configured to sense battery parameters.

16 Claims, 5 Drawing Sheets

(56) References Cited

U.S. PATENT DOCUMENTS

2011/0128154 A1* 6/2011 Herrema ............ G01F 23/0061
340/636.21
2014/0266230 A1* 9/2014 Jones ................. H01M 10/484
324/434

OTHER PUBLICATIONS

Acuity Battery Monitoring System Datasheet, Curtis Instruments, Jan. 2013, 3 pages.
Acuity Battery Monitoring System Installation Instructions, Curtis Instruments, Apr. 2010, 3 pages.
Overmolded Temp/Level Sensor Assy for ABSoC [17668402-XXX F], Curtis Instruments redacted drawings, Mar. 2010, 2 pages.

* cited by examiner

ADJUSTABLE LENGTH BATTERY ELECTROLYTE PROBE

BACKGROUND

Field of the Invention

The invention relates to a battery electrolyte probe and, more particularly, to an adjustable length battery electrolyte probe.

Brief Description of Prior Developments

Figure 1:
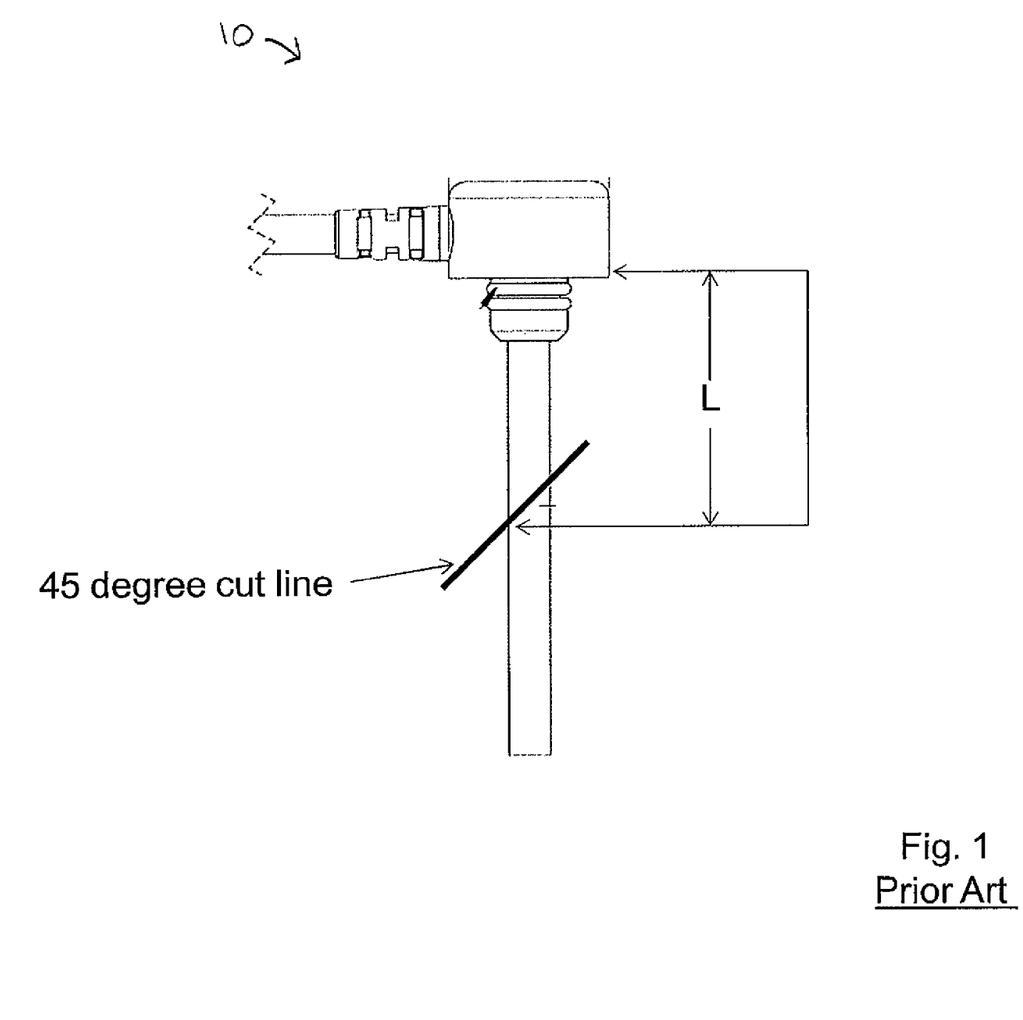
FIG. 1 is a partial front view of conventional battery probe.

Batteries, such as lead-acid batteries for example, are used in commercial and industrial applications for various types of equipment including fork-lift trucks, battery powered vehicles, sweeper/scrubbers and other industrial equipment. At times it is necessary to measure parameters associated with liquid battery electrolyte as an aftermarket requirement. Third party suppliers generally provide probes for this purpose that are inserted into the battery through the battery cap opening or via a hole drilled through the battery case. The installation of these probes is often done in the field. Drilling holes through battery cases is complicated and can be dangerous, especially when performed in the field. Installation is generally complicated and wasteful by having to cut the probe to the proper length (based on the specific battery dimensions) and discarding the unused portion. A potential safety hazard is exposed if the metallic portion of the probe should make contact with high current, electrically conductive battery elements such as the electrodes or cell plates. For example, FIG. 1 shows a conventional probe 10 which is configured to be cut to the measured length (L) by a hacksaw, cut-off wheel or grinder (at the 45 degree cut line).

Accordingly there is a need for an improved battery probe having increased capabilities while maintaining robust, safe and reliable product configurations.

SUMMARY

In accordance with one aspect of the invention, an apparatus is disclosed. The apparatus includes a sensor head section, a base section, a telescoping section, and an electronic component. The base section is connected to the sensor head section. The telescoping section includes a first end and a second end. The telescoping section is connected to the base section. The electronic component is proximate the first end of the telescoping section. The electronic component is protected from making contact with high current, electrically conductive battery elements and configured to sense battery parameters.

In accordance with another aspect of the invention, a battery electrolyte probe is disclosed. The battery electrolyte probe includes a sensor head section, a base section, a telescoping section, and a transducer. The base section is connected to the sensor head section. The telescoping section includes a first end and a second end. The telescoping section is movably connected to the base section. The transducer is proximate the first end of the telescoping section. The transducer is protected from making contact with high current, electrically conductive battery elements and configured to sense battery electrolyte parameters.

In accordance with another aspect of the invention, a method is disclosed. A sensor head section is provided. A base section is connected to the sensor head section. A telescoping section is movably connected to the base section. The telescoping section includes a first end and a second end. An electronic component is provided proximate the first end of the telescoping section. The electronic component is protected from making contact with high current, electrically conductive battery elements and configured to sense battery parameters.

BRIEF DESCRIPTION OF THE DRAWINGS

The foregoing aspects and other features of the invention are explained in the following description, taken in connection with the accompanying drawings, wherein.

DETAILED DESCRIPTION

Figure 2:
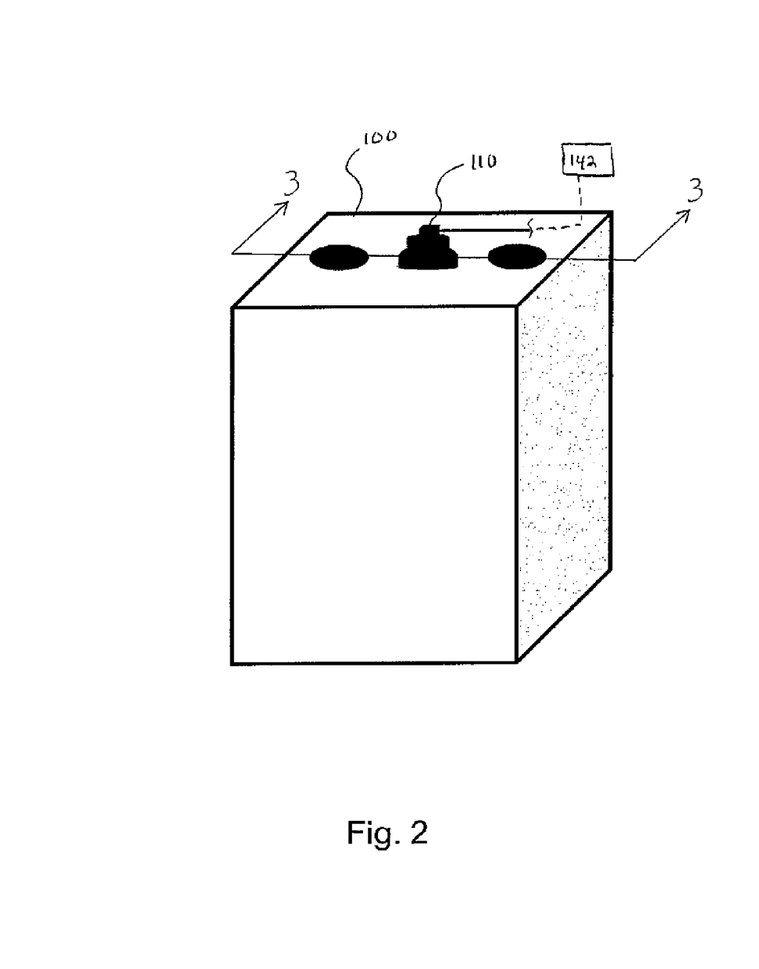
FIG. 2 is a perspective view of a battery cell with an installed probe incorporating features of the invention.

Referring to FIG. 2, there is shown a perspective view of a battery probe 110 (installed in a battery cell 100) incorporating features of the invention. Although the invention will be described with reference to the exemplary embodiments shown in the drawings, it should be understood that the invention can be embodied in many alternate forms of embodiments. In addition, any suitable size, shape or type of elements or materials could be used.

Figure 3:
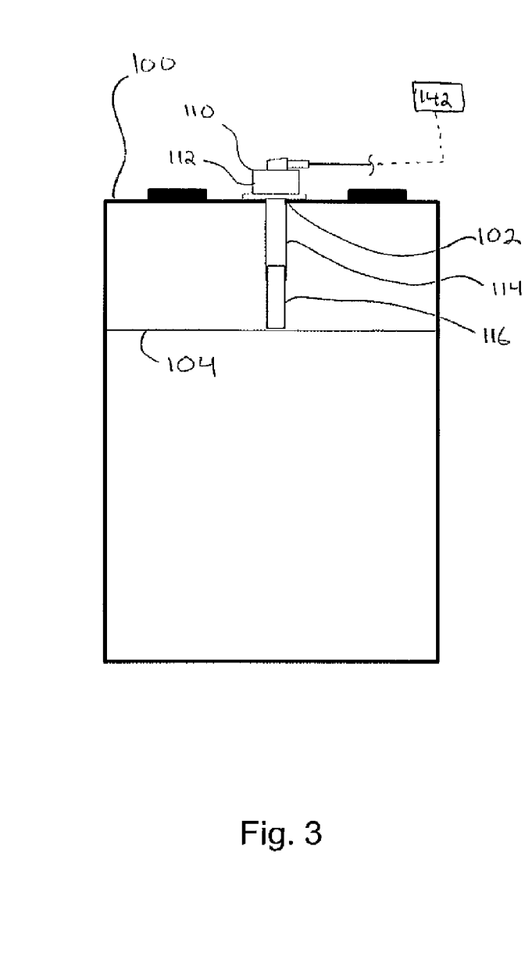
FIG. 3 is a cross section view of the battery cell and probe shown in FIG. 2.

Referring now also to the section view shown in FIG. 3, the battery probe 110 may be installed through an opening 102 of the battery cell 100. The battery probe 110 comprises a sensor head section 112, a base section 114, and a telescoping section 116. The battery probe 110 provides a novel, cost reduced approach which simplifies field installation of an electrolyte measurement probe in battery cells of varying depths.

Figure 4:
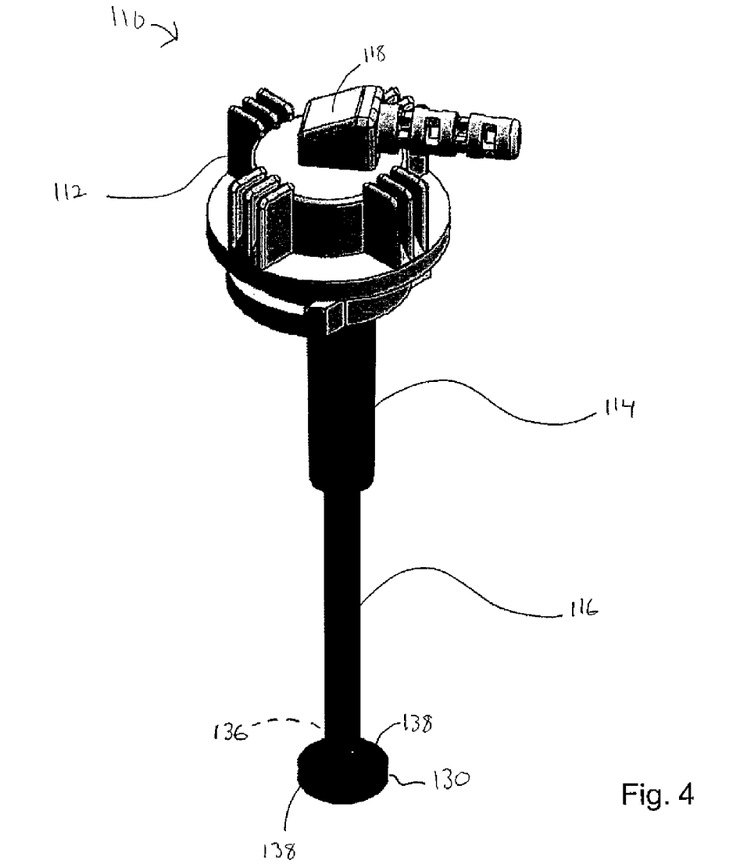
FIG. 4 is an enlarged perspective view of the battery probe shown in FIG. 2.

Referring now also to FIG. 4, the sensor head section 112 is suitably sized and shaped to cover the battery opening 102. The sensor head section 112 may be formed from a molded plastic material. However, in alternate embodiments, any suitable type of material may be provided. According to some embodiments of the invention, the sensor head section 112 may be configured to be attachable to the battery opening 112. For example, in some embodiments the sensor head section 112 may be configured to provide a press fit, snap-fit, or a threaded connection to the battery opening 112. However in alternate embodiments any other suitable type of fastening configuration may be provided. It should further be understood that while various exemplary embodiments of the invention have been described in connection with the sensor head section 112 covering or connecting to the battery opening 102, one skilled in the art will appreciate that the invention is not necessarily so limited and that in alternate embodiments the sensor head section 112 may cover or be connected to a battery cap, a battery vent, or any other suitable type of battery opening or part of the battery.

The sensor head section may further comprise a wiring housing portion 118. According to some embodiments of the invention, the wiring housing portion 118 may be integrally formed with the sensor head section 112. In some other embodiments, the wiring housing portion 118 could be a separate member fixedly attached to the sensor head section 112. However, it should be noted that in alternate embodiments, any suitable configuration for the wiring housing portion and sensor head section may be provided.

Figure 5:
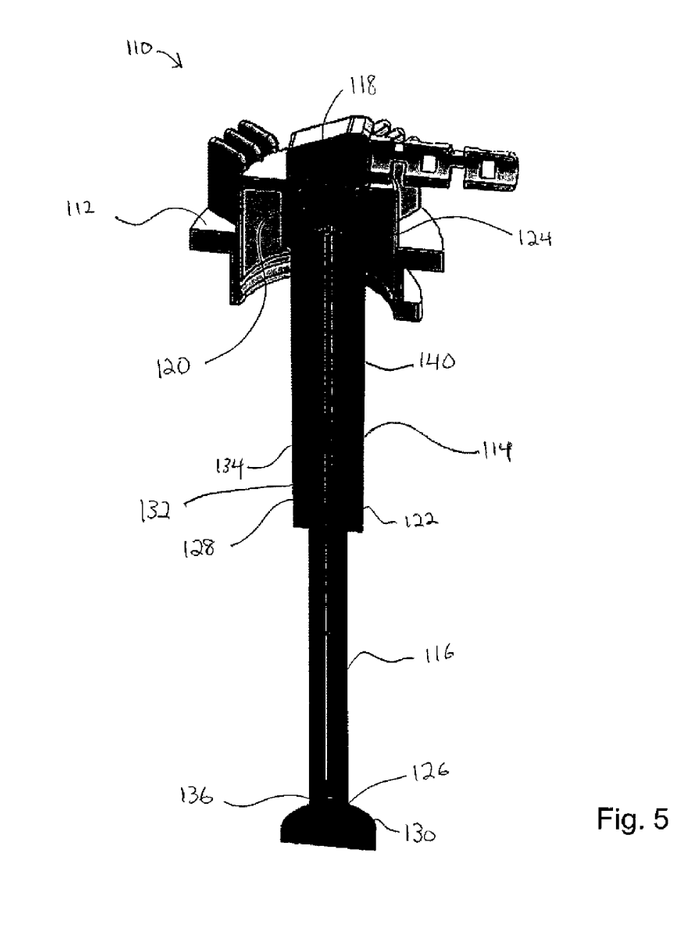
FIG. 5 is a cross section view of FIG. 4.

Referring now also to the section view shown in FIG. 5, the base section 114 comprises a first end 120 and an opposite second end 122. The base section 114 generally comprises a hollow, cylindrical element fabricated from low cost molded plastic, resistant to acid and electrically non-conductive. The first end 120 is at the sensor head section 112 and surrounds a bottom end 124 of the wiring housing portion 118. In some embodiments, the first end 120 of the base section 114 is attached to the bottom end 124 of the wiring housing portion by a press fit between an inside diameter of the first end 120 of the base section 114 and an outer surface of the bottom end 124 of the wiring housing portion 118. In some other embodiments, the first end 120 of the base section 114 may be directly attached to the sensor head section 112. Additionally, in some other alternative embodiments, the first end 120 of the base section 114 may be fixed to a battery cap (or battery cap opening) to allow for simple insertion of the probe assembly into the battery cell. However, it should be noted that any suitable configuration for connecting the base section to the sensor head section or the battery may be provided.

The telescoping section 116 comprises a first end 126 and an opposite second end 128. The telescoping section 116 generally comprises a hollow, cylindrical element fabricated from low cost molded plastic, resistant to acid and electrically non-conductive. The first end 126 (or distal end of the probe assembly) comprises a bottom tip portion 130 which is generally formed into a large circular flat surface to allow the assembly to be pressed and 'adjusted' against an immovable surface 104 in the battery cell 100 (see FIG. 3). The second end 128 of the telescoping section is configured to be moveable along an inside diameter of the base section 114, wherein the second end 128 is configured to friction fit to the inside diameter of the base section 114 to allow a restricted sliding action when the bottom tip portion 130 of the assembly is pressed against the immovable surface 104 within the battery cell 100. The friction fit allows the probe 110 to retain its 'adjusted' length after it is inserted into the cell 100 and pressed against the immovable surface 104. It should be understood that the immovable surface 104 of the battery cell 100 can be a separator of the battery, high current battery elements such as the electrodes or cell plates (including a surface of the battery cell plates), or any other suitable battery cell portion. The plastic, electrically non-conductive portions of the probe do not allow the electrically conductive transducer to make contact with any high current, electrically conductive battery elements.

According to some embodiments of the invention, the second end 128 of the telescoping section 116 comprises a notch portion 132 configured to be received with a groove portion 134 of the base section 114 for alignment purposes. However in alternate embodiments, any suitable type of configuration could be provided.

The telescoping section 116 further comprises an electronic component 136 at the first end 126 of the telescoping section 116. According to some embodiments of the invention, the electronic component can be a small, acid resistant, special alloy transducer used for measuring electrolyte parameters. However in alternate embodiments, the electronic component can be any suitable component configured to measure/sense battery electrolyte parameters. The transducer 136 may be insert-molded into the first end 126 of the telescoping section 116 such that only the side surfaces of the transducer 136 are exposed to the electrolyte (through openings 138). This allows the distal end of the plastic probe assembly 130 to make contact with the high current elements contained within the battery cell 100 when the probe assembly is inserted into the cell 100. It should be understood that the side portions of the transducer are insert molded in a way to be recessed into the first end of 126, reducing or eliminating the opportunity for the transducer to make electrical contact with any of the high current, electrically conductive battery elements.

According to various exemplary embodiments of the invention the electronic component is configured to measure battery parameters, such as battery electrolyte parameters, electrolyte level, temperature, chemistry, chemical reaction rates and other physical values that are of interest for monitoring battery status and health. However in alternate embodiments, any suitable type of parameters may be measured/sensed by the electronic component.

The battery electrolyte probe 110 further comprises a harness 140 (a portion of which is shown in FIG. 5) which generally passes through the entire length of the probe assembly. One end of the harness 140 is connected to the transducer 136. The other end of the harness passes through the telescoping section 116, the base section 114, the battery opening 102, and the sensor head section 112 (including the wiring housing portion 118), and terminates at the signal processing electronics 142 (see FIGS. 2, 3).

While various exemplary embodiments of the invention have been described in connection with one telescoping portion, one skilled in the art will appreciate that the invention is not necessarily so limited and that in alternate embodiments more than one telescoping section may be provided.

Figure 6:
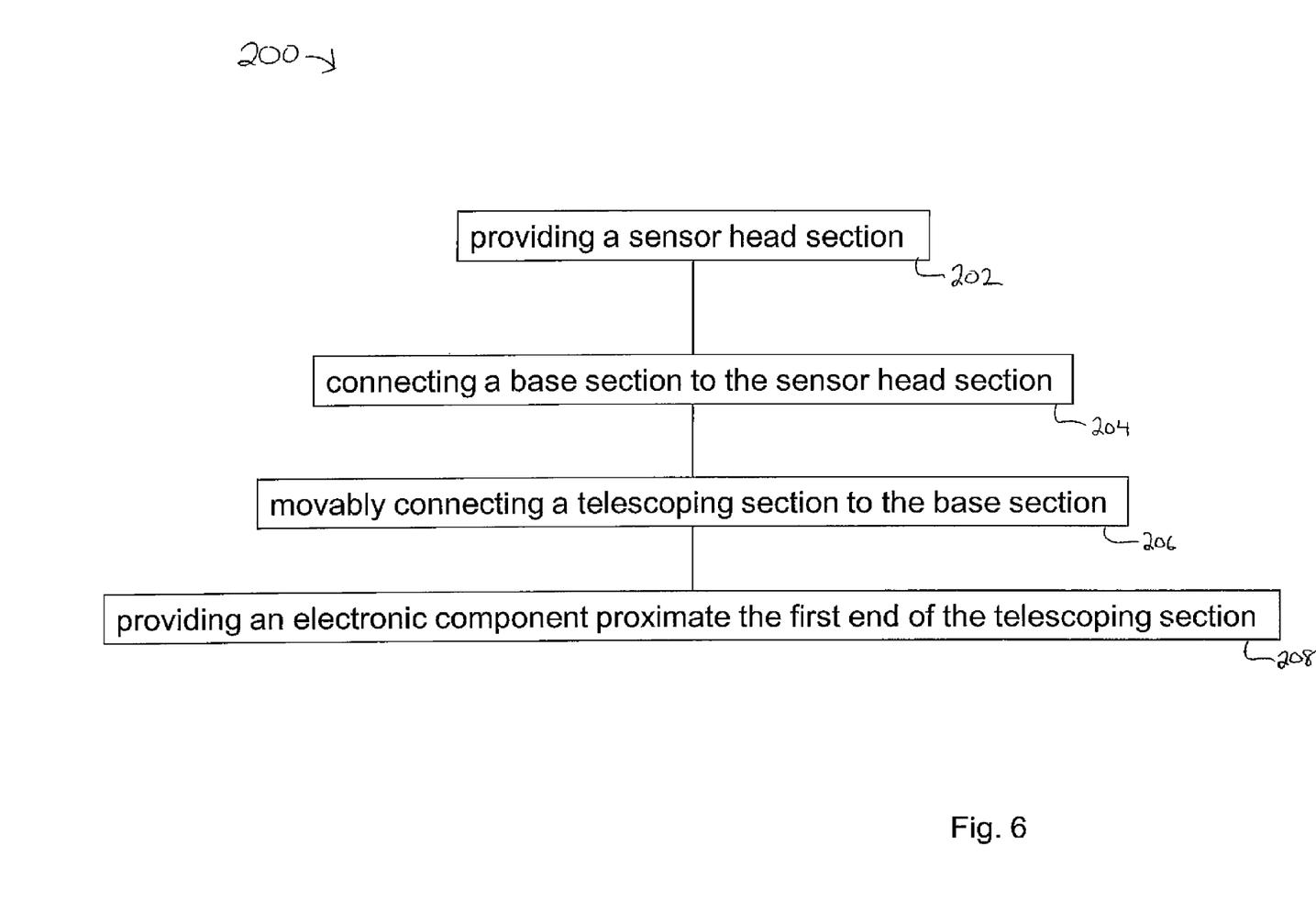
FIG. 6 is a block diagram of an exemplary method of the probe shown in FIG. 2.

FIG. 6 illustrates a method 200. The method 200 includes providing a sensor head section (at block 202). Connecting a base section to the sensor head section (at block 204). Movably connecting a telescoping section to the base section, wherein the telescoping section comprises a first end and a second end (at block 206). Providing an electronic component proximate the first end of the telescoping section, wherein the electronic component is protected from making contact with high current, electrically conductive battery elements and configured to sense battery parameters (at block 208). It should be noted that the illustration of a particular order of the blocks does not necessarily imply that there is a required or preferred order for the blocks and the order and arrangement of the blocks may be varied. Furthermore it may be possible for some blocks to be omitted.

Technical effects of any one or more of the exemplary embodiments provide an improved low cost probe that adapts to various battery cell depths and retains configuration. Various exemplary embodiments further provide for field installation that is simplified and safe, when compared to conventional configurations.

For example, since conventional probes are required to be cut to a measured length by a hacksaw, cut-off wheel or grinder, various considerations and precautions must be taken as the battery electrolyte is a harsh environment which includes strong acids and other chemicals that can damage sensitive electronics and related transducers used for signal measurement purposes. The signal processing electronics, associated harnessing, and transducers must be protected by acid resistant materials that are expensive and not readily available. Generally, the transducer materials are comprised of special acid resistant alloys that comprise the length of the probe. These alloys are expensive and not readily available as a machined product.

Another technical effect of any one or more of the exemplary embodiments provide an improved adjustable probe configuration having only one part (i.e. only one SKU) for various different battery cells. For example, conventional configurations have to account for the variety of battery cell dimensions, specifically depth. For accurate electrolyte measurements, it is often necessary to make sure the measurement probe extends down to the surface of the battery cell plates. The variation in depth requires a multitude of conventional product SKUs that provide probes of various lengths. Alternatively, a single product SKU may be made long enough to accommodate multiple battery depths, but installation is complicated and wasteful by having to cut the probe to the proper length and discarding the unused portion. Furthermore, a potential safety issue is exposed in conventional configurations if the metallic portion of the probe should make contact with high current battery elements such as the electrodes or cell plates.

It should be understood that components of the invention can be operationally coupled or connected and that any number or combination of intervening elements can exist (including no intervening elements). The connections can be direct or indirect and additionally there can merely be a functional relationship between components.

Below are provided further descriptions of various non-limiting, exemplary embodiments. The below-described exemplary embodiments may be practiced in conjunction with one or more other aspects or exemplary embodiments. That is, the exemplary embodiments of the invention, such as those described immediately below, may be implemented, practiced or utilized in any combination (e.g., any combination that is suitable, practicable and/or feasible) and are not limited only to those combinations described herein and/or included in the appended claims.

In one exemplary embodiment, an apparatus comprising: a sensor head section; a base section connected to the sensor head section; a telescoping section comprising a first end and a second end, wherein the telescoping section is connected to the base section; and an electronic component proximate the first end of the telescoping section, wherein the electronic component is protected from making contact with high current, electrically conductive battery elements and configured to sense battery parameters.

An apparatus as above wherein the electronic component comprises a transducer.

An apparatus as above wherein the transducer is configured to sense battery electrolyte parameters.

An apparatus as above wherein the second end of the telescoping section is connected the base section.

An apparatus as above wherein the telescoping section is slidably connected to the base section.

An apparatus as above wherein the telescoping section and the base section are friction fit to each other.

An apparatus as above further comprising a harness between the sensor head section and the transducer.

An apparatus as above wherein the telescoping section comprises a bottom tip portion proximate the first end of the telescoping section.

An apparatus as above wherein the telescoping portion comprises a first outside diameter, wherein the bottom tip portion comprises circular flat surface having a second outside diameter, and wherein the second outside diameter is greater than the first outside diameter.

An apparatus as above wherein the base section comprises a first end and a second end, wherein the first end is connected to the sensor head section, wherein the first end is configured to be proximate a battery opening, and wherein the second end of the base section surrounds the second end of the telescoping section.

An apparatus as above wherein the telescoping section comprises an inside diameter and an outside diameter, wherein the telescoping section comprises an opening extending between the inside diameter and the outside diameter, and wherein the opening is configured to allow a side surface of the electronic component to be exposed but does not allow it to contact high current, electrically conductive battery elements.

An apparatus as above wherein the second end of the telescoping section is inside the base section, wherein the telescoping section is movably connected the base section, and wherein the first end of the telescoping section is configured to be adjustable to a plurality of lengths from the base section.

An apparatus as above further comprising a wiring harness, wherein one end of the wiring harness is connected to the electronic component, and wherein an opposite end of the wiring harness is connected to signal processing electronics.

An apparatus as above wherein the electronic component is configured to sense battery electrolyte level, battery temperature, battery chemistry, and/or battery chemical reaction rates.

An apparatus as above wherein the apparatus is a battery electrolyte probe.

In another exemplary embodiment, a battery electrolyte probe comprising: a sensor head section; a base section connected to the sensor head section; a telescoping section comprising a first end and a second end, wherein the telescoping section is movably connected to the base section; and a transducer proximate the first end of the telescoping section, wherein the transducer is protected from making contact with high current, electrically conductive battery elements and configured to sense battery electrolyte parameters.

A battery electrolyte probe as above further comprising a wiring harness, wherein one end of the wiring harness is connected to the transducer, and wherein an opposite end of the wiring harness is configured to be connected to signal processing electronics.

A battery electrolyte probe as above wherein the transducer is configured to sense battery electrolyte level, battery temperature, battery chemistry, and/or battery chemical reaction rates.

In another exemplary embodiment, a method comprising: providing a sensor head section; connecting a base section to the sensor head section; movably connecting a telescoping section to the base section, wherein the telescoping section comprises a first end and a second end; and providing an electronic component proximate the first end of the telescoping section, wherein the electronic component is protected from making contact with high current, electrically conductive battery elements and configured to sense battery parameters.

A method as above further comprising connecting a wiring harness between the sensor head section and the electronic component.

It should be understood that the foregoing description is only illustrative of the invention. Various alternatives and modifications can be devised by those skilled in the art without departing from the invention. Accordingly, the invention is intended to embrace all such alternatives, modifications and variances which fall within the scope of the appended claims.

What is claimed is:
1. An apparatus comprising: a sensor head section; a base section connected to the sensor head section; a telescoping section comprising a first end and a second end, wherein the telescoping section is connected to the base section; and an electronic component proximate the first end of the telescoping section, wherein the electronic component is protected from making contact with high current, electrically conductive battery elements and configured to sense battery parameters, wherein the telescoping section is slidably connected to the base section, wherein the telescoping section comprises a bottom tip portion proximate the first end of the telescoping section, wherein the telescoping portion comprises a first outside diameter, wherein the bottom tip portion comprises circular flat surface having a second outside diameter, and wherein the second outside diameter is greater than the first outside diameter, and wherein the apparatus is a battery electrolyte probe.

2. An apparatus as in claim 1 wherein the second end of the telescoping section is connected the base section.

3. An apparatus as in claim 1 wherein the telescoping section and the base section are friction fit to each other.

4. An apparatus as in claim 1 further comprising a harness between the sensor head section and the transducer.

5. An apparatus as in claim 1 wherein the base section comprises a first end and a second end, wherein the first end is connected to the sensor head section, wherein the first end is configured to be proximate a battery opening, and wherein the second end of the base section surrounds the second end of the telescoping section.

6. An apparatus as in claim 1 wherein the telescoping section comprises an inside diameter and an outside diameter, wherein the telescoping section comprises an opening extending between the inside diameter and the outside diameter, and wherein the opening is configured to allow a side surface of the electronic component to be exposed but does not allow it to contact high current, electrically conductive battery elements.

7. An apparatus as in claim 1 wherein the second end of the telescoping section is inside the base section, wherein the telescoping section is movably connected the base section, and wherein the first end of the telescoping section is configured to be adjustable to a plurality of lengths from the base section.

8. An apparatus as in claim 1 further comprising a wiring harness, wherein one end of the wiring harness is connected to the electronic component, and wherein an opposite end of the wiring harness is connected to signal processing electronics.

9. An apparatus as in claim 1 wherein the electronic component is configured to sense battery electrolyte level, battery temperature, battery chemistry, and/or battery chemical reaction rates.

10. An apparatus as in claim 1 wherein the electronic component comprises a transducer.

11. An apparatus as in claim 10 wherein the transducer is configured to sense battery electrolyte parameters.

12. A battery electrolyte probe comprising: a sensor head section; a base section connected to the sensor head section; a telescoping section comprising a first end and a second end, wherein the telescoping section is movably connected to the base section; and a transducer proximate the first end of the telescoping section, wherein the transducer is protected from making contact with high current, electrically conductive battery elements and configured to sense battery electrolyte parameters, wherein the telescoping section comprises a bottom tip portion proximate the first end of the telescoping section, wherein the telescoping portion comprises a first outside diameter, wherein the bottom tip portion comprises circular flat surface having a second outside diameter, and wherein the second outside diameter is greater than the first outside diameter.

13. A battery electrolyte probe as in claim 12 further comprising a wiring harness, wherein one end of the wiring harness is connected to the transducer, and wherein an opposite end of the wiring harness is configured to be connected to signal processing electronics.

14. A battery electrolyte probe as in claim 12 wherein the transducer is configured to sense battery electrolyte level, battery temperature, battery chemistry, and/or battery chemical reaction rates.

15. A method comprising: providing a sensor head section; connecting a base section to the sensor head section; movably connecting a telescoping section to the base section, wherein the telescoping section comprises a first end and a second end; and providing an electronic component proximate the first end of the telescoping section, wherein the electronic component is protected from making contact with high current, electrically conductive battery elements and configured to sense battery parameters, wherein the electronic component comprises a transducer, wherein the transducer is configured to sense battery electrolyte parameters, wherein the telescoping section comprises a bottom tip portion proximate the first end of the telescoping section, wherein the telescoping portion comprises a first outside diameter, wherein the bottom tip portion comprises circular flat surface having a second outside diameter, and wherein the second outside diameter is greater than the first outside diameter.

16. A method as in claim 15 further comprising connecting a wiring harness between the sensor head section and the electronic component.

* * * * *